United States Patent
Mohammed et al.

(10) Patent No.: US 8,659,317 B1
(45) Date of Patent: Feb. 25, 2014

(54) FLEXIBLE MULTI-POINT ROUTING TOPOLOGY

(75) Inventors: Haneef Mohammed, Beaverton, OR (US); Hans Klein, Pleasanton, CA (US); Mark Hastings, Mukilteo, WA (US); Harold Kutz, Edmonds, WA (US); Kyle Kearney, Portland, OR (US); Jean-Paul Vanitegem, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 35 days.

(21) Appl. No.: 13/538,997

(22) Filed: Jun. 29, 2012

Related U.S. Application Data

(60) Provisional application No. 61/621,778, filed on Apr. 9, 2012.

(51) Int. Cl.
G06F 7/38 (2006.01)
(52) U.S. Cl.
USPC ............................................. 326/39; 326/41
(58) Field of Classification Search
None
See application file for complete search history.

(56) References Cited

U.S. PATENT DOCUMENTS

| | | | |
|---|---|---|---|
| 6,128,292 A | 10/2000 | Kim et al. | |
| 6,526,558 B2 | 2/2003 | Agrawal et al. | |
| 6,873,928 B2 | 3/2005 | Thurman et al. | |
| 7,017,138 B2 | 3/2006 | Zirojevic et al. | |
| 7,764,619 B2 | 7/2010 | Mathena et al. | |
| 7,863,724 B2 | 1/2011 | Douriet et al. | |
| 7,992,122 B1 | 8/2011 | Burstein et al. | |
| 2005/0218398 A1* | 10/2005 | Tran | 257/14 |
| 2008/0239791 A1* | 10/2008 | Tran | 365/151 |
| 2011/0304354 A1 | 12/2011 | Snyder et al. | |

OTHER PUBLICATIONS

Trumler, W. et al. (Date Unknown). "Self-Optimized Routing in a Network-On-A-Chip," Univeristy of Augsbrug, 14 pages.
Hathaway, D.J. (Jul. 1996). "Circuit Placement, Chip Optimization, and Wire Routing for IBM IC Technology," IEEE, 1 page. (Abstract only).
Wolinski, C.(Apr. 14-1, 2008). "Optimization of Routing and Reconfiguration Overhead in Programmable Processor Array Architectures," IEEE,1 page. (Abstract only).

* cited by examiner

*Primary Examiner* — Crystal L Hammond

(57) ABSTRACT

Apparatuses and methods of configuring a programmable analog routing system to make connections between analog functional blocks of an integrated circuit are described. A programmable analog routing system includes a first set of wires and switch sets of programmable connections coupled to a second set of wires. The programmable connections are configured to make at least one of a direct connection between two of the analog functional blocks using the second set of wires or a connection between one of the second set of wires and one of the first set of wires.

20 Claims, 11 Drawing Sheets

FLEXIBLE MULTI-POINT ROUTING TOPOLOGY

RELATED APPLICATIONS

This application claims the benefit of U.S. Provisional Application No. 61/621,778, filed Apr. 9, 2012, the entire contents of which are incorporated by reference.

TECHNICAL FIELD

The present disclosure relates generally to processing devices and particularly to processing devices having programmable resources.

BACKGROUND

Processing devices, such as microcontrollers, may have embedded processors, memories and special function analog and digital circuits. The processing devices may have multiple functional blocks. Typical analog circuits found in prior art microcontrollers include Continuous Time (CT) amplifiers having preset functions with given functional parameters. For instance, a CT analog amplifier might be configured as a fixed function circuit, such as a voltage amplifier, in which certain parameters, such as gain or bandwidth might be altered by programming.

Switched Capacitor (SC) analog circuits are also frequently incorporated into microcontroller designs. SC analog circuits in prior art are somewhat more versatile than CT analog circuits in that it might be possible to alter both the circuit function as well as the parameters of the circuit function by programming. However, both CT and SC analog circuits found in current microcontrollers generally require programming before utilization, and neither can be dynamically programmed (programmed "on-the-fly").

In the conventional art, general purpose digital circuits are frequently included in a microcontroller implementation. Such digital circuits are pre-programmed to realize certain digital functions such as logical operations, arithmetical functions, counting, etc. These digital circuits are generally in the form of a Programmed Logic Array (PLA) or FPGA. Furthermore, such digital circuits that require pre-programming are generally not dynamically programmable (programmable "on-the-fly"). The main difficulty here is in the generality of such a digital circuit, which requires an excessive amount of digital logic, which in turn occupies a large area on a semiconductor chip as well as an increased cost of manufacturing.

Several other design considerations related to microcontroller utilization either go unaddressed, or require separate functionalities to enable them. For instance, existing designs do not offer a programmable analog circuit array with both CT analog circuits and SC analog circuits on the same semiconductor chip with a programmable array of digital circuits. As a result, realization of a function requiring complex communication between analog circuits and digital circuits often requires the use of multiple semiconductor chips. Further, existing microcontroller realizations generally require pre-programming and cannot be dynamically programmed.

In a programmable device, it is necessary to route signals in a user-configurable manner between arbitrary or nearly arbitrary sets of terminals. The device should contain a number of wires and switches that can be used to implement the aforementioned routes. This routing structure needs to be flexible because it is difficult to predict most situations in which the programmable device could be used. In general, a greater number of switches may produce a more flexible routing structure. However, it is also necessary to minimize the number of switches for two reasons. Firstly, a large number of switches may consume an excessive amount of silicon area. Secondly, each switch may degrade signal quality by a measurable amount. This includes both "used" switches, which are traversed to implement a route, and unused switches "hanging off" of a wire traversed in a route.

BRIEF DESCRIPTION OF THE DRAWINGS

The present invention is illustrated by way of example, and not of limitation, in the figures of the accompanying drawings in which.

DETAILED DESCRIPTION

Apparatuses and methods of configuring a programmable analog routing system to make connections between analog functional blocks of an integrated circuit are described. A programmable analog routing system includes a first set of wires and multiple switch sets of programmable connections coupled to a second set of wires. The programmable connections are configured to make at least one of a direct connection between two of the analog functional blocks using the one or more of the second set of wires or a connection between one of the second set of wires and one of the first set of wires to connect to a third programmable block. The analog functional blocks may be fixed-function blocks or programmable blocks. In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

The embodiments described herein involve the strategic placement of a small number of wires switches to achieve a delicate balance between performance, flexibility, and area. Routes are optimized between sets of terminals of analog functional blocks which are expected to be frequently connected together. At the same time, few wires or switches are dedicated to a single purpose, allowing them to serve purposes which were not anticipated during hardware design. Conventionally, an analog subsystem of a processing device uses a configurable analog routing interconnect including several global buses and several local buses, such as described below with respect to FIGS. 1A and 1B. Connectivity, particularly to general-purpose input-output (GPIO) pins may be constrained in conventional routing interconnects. Also, in conventional routing interconnects, there may be a number of dependencies between components which made placement very difficult.

Figure 1A:
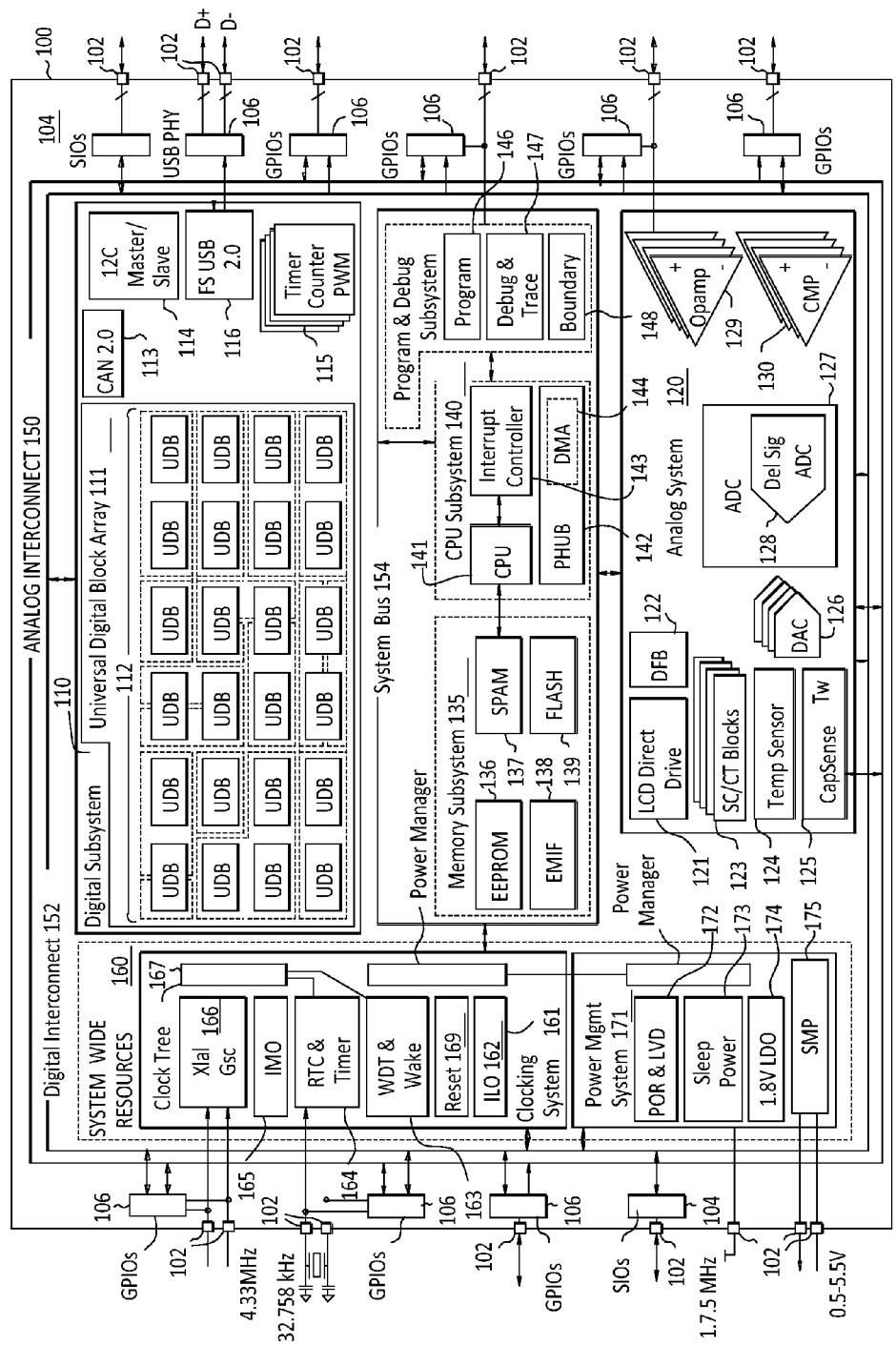
FIG. 1A illustrates an embodiment of a core architecture of a processing device.

FIG. 1A illustrates an embodiment of a core architecture of a processing device 100. In one embodiment, the processing device 100 is a core architecture of the Programmable System-on-Chip (PSoC®) device, such as that used in the PSoC® family of products offered by Cypress Semiconductor Corporation (San Jose, Calif.). In one embodiment, the processing device 100 has the PSoC®3 or PSoC®5 core architecture, each developed by Cypress Semiconductor Corporation. In one embodiment, the core architecture includes a digital subsystem 110. The digital subsystem 110 includes a universal digital block array 111, including multiple universal digital blocks (UDBs) 112, a CAN 2.0 interface controller (CAN 2.0) 113, an I2C Master and Slave controller (I2C M/S) 114, multiple multifunction digital blocks (MDBs) 115 and a full-speed USB 2.0 interface controller (FSUSB 2.0) 116. MDBs 115 may be configured to perform common digital functions such as timers, counters and pulse-width modulators (PWMs). Digital subsystem 110 may also include communication peripherals such as Ethernet, high-speed USB, USB host, PCI Express, IEE1394 serial bus interface, SD card reader and others (not shown) The elements of digital system 110 may be coupled to digital interconnect 152 and/or to the system bus 154.

The core architecture may also include an analog subsystem 120. The analog subsystem may include an LCD direct drive block 121, a digital filter block (DFB) 122, multiple switched-capacitor/continuous time mixed-function analog (SC/CT) blocks 123, a temperature sensor block 124, a capacitive sensing (CapSense™) block 125, multiple digital-to-analog converters 126, an analog-to-digital converter (ADC) 127 including a delta-sigma ADC 128, multiple operational amplifiers (opamps) 129 and multiple comparators (CMP) 130. Analog subsystem 120 may include successive approximation registers (SARs), programmable gain amplifiers (PGAs) and other analog peripherals (not shown). The elements of analog subsystem 120 may be coupled to analog interconnect 150 and/or the system bus 154. CapSense™ block 125 may be coupled to the analog interconnect 150 separate from other elements of analog subsystem 120.

The core architecture 100 may also include memory subsystem 135, CPU subsystem 140 and programming and debug subsystem 145. Memory subsystem 135 may include an EEPROM block 136, synchronous random access memory (SRAM) 137, an external memory interface (EMIF) block 138, and flash memory (FLASH) 139. Memory subsystem 135 may also include a memory cache or memory accelerator (not shown). CPU subsystem 140 may include a CPU 141, an interrupt controller 142 and a bus bridge controller (DMA/PHUB) 143, which may include a direct memory access (DMA) controller 144. The program and debug subsystem 145 may include a programming block 146, and debug and trace block 147 and a boundary scan block 148. The program and debug subsystem may be coupled to the CPU subsystem. The CPU subsystem and the memory system may be coupled to system bus 154. The memory subsystem 135 may be coupled to the CPU subsystem 140 through the system bus 154. In one embodiment, FLASH 139 may be coupled to the CPU 141 directly.

The core architecture 100 may also include system-wide resources 160. System-wide resources may include a clocking subsystem 161 and power management subsystem 171. Clocking subsystem 161 may include an internal low-speed oscillator block (ILO) 162, a watch-dog timer (WDT) and wake-up controller block 163, a real-time clock (RTC)/timer block 164, an internal main oscillator block (IMO) 165, a crystal oscillator block (Xtal Osc) 166, a clock tree 167, power manager 168 and reset block 169. In one embodiment the RTC/timer block 164 and the ILO 162 may be coupled to the WDT and wake-up controller block 163. In another embodiment, clock tree 167 may be coupled to Xtal Osc block 166 and IMO 165. Power management system 171 may include power-on-reset (POR) and low-voltage-detect (LVD) block 172, a sleep power block 173, a 1.8V internal regulator (LDO) 174, a switched mode power supply (e.g., switch-mode pump, SMP) 175 and power manager 178. The switched mode power supply may implement a boost circuit, a bust circuit or both. Power manager 178 may be coupled to power manager 168 of the clocking subsystem 161. In one embodiment, system-wide resources 160 may be coupled to system bus 154.

The core architecture 100 may also include multiple pins 102. Pins 102 may be used to connect elements of core architecture 100 to off-chip elements or route signals into, out of on-chip elements or to different pins of the device. Core architecture 100 may also include multiple special input/outputs (SIOs) 104 and GPIOs 106. SIOs 104 may be coupled to digital interconnect 152. GPIOs 106 may be coupled to analog interconnect 150, digital interconnect 152, RTC/timer block 164, and/or Xtal Osc block 166. Core architecture may also include USB input/outputs (USB PHY) 108, which may be coupled to FSUSB 2.0 116. In conventional solutions, the analog subsystem uses a configurable analog routing interconnect consisting of several global buses and several local buses, such as illustrated and described in FIG. 1B.

Figure 1B:
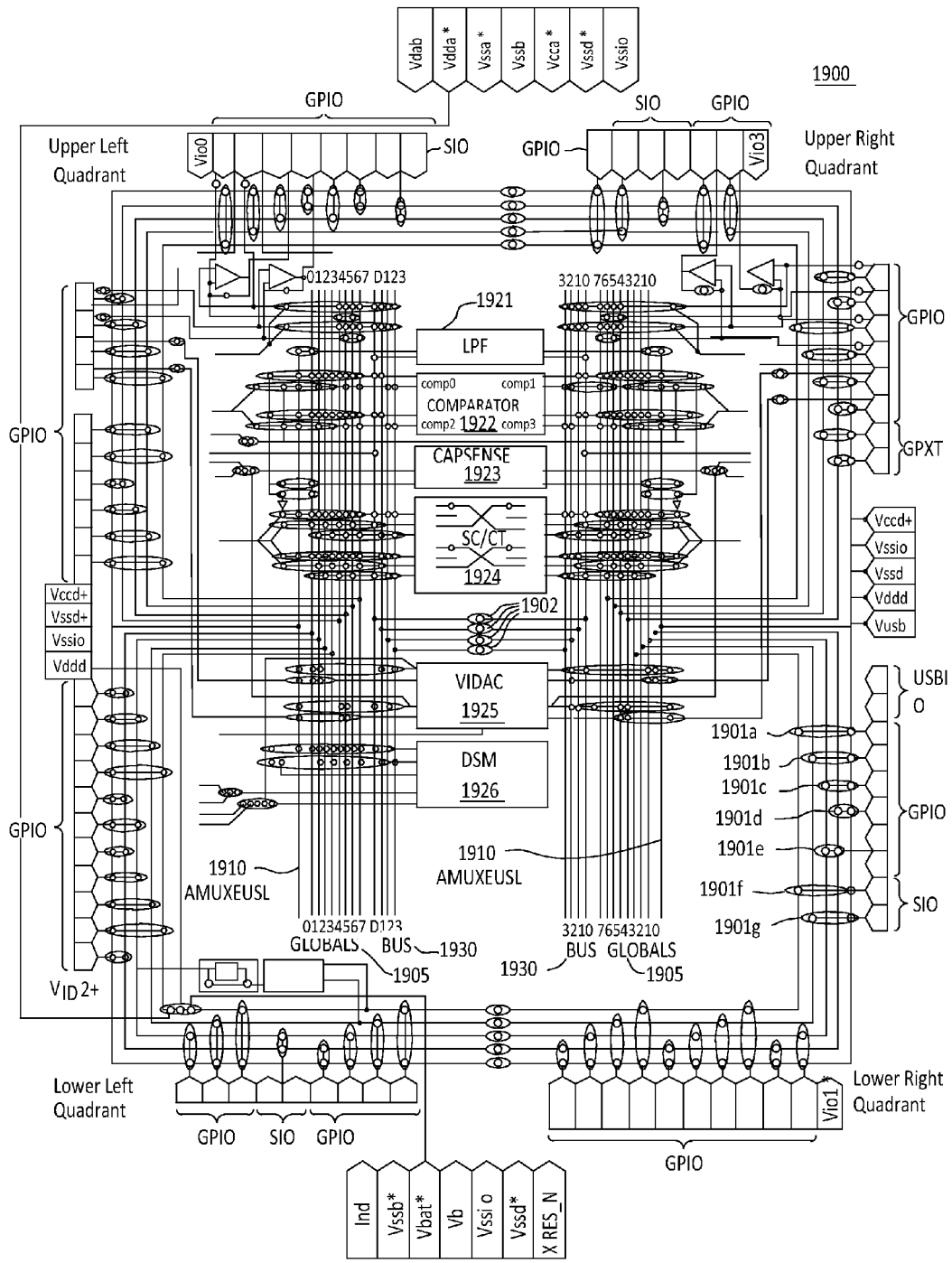
FIG. 1B illustrates one embodiment of internal and external analog routing.

FIG. 1B illustrates one embodiment of internal and external analog routing 1900, examples of which is shown in FIG. 1A (150). Analog routing 1900 exists as a series of buses, switches and MUXs that interwoven amongst the analog subsystem (e.g., 120, FIG. 1A), which allows analog blocks, banks of blocks and channels to be connected to each other, to internal and external reference signals, to mixed-signal blocks (such as DACs) as well as to GPIO. Analog routing 1900 includes sixteen analog global buses (AG) 1905 and two analog MUX buses (AMUXBUS) 1910. AGs and AMUX-BUSes may connect GPIOs 1915 to analog functional blocks. Analog functional blocks may include a low-pass filter 1921, a comparator 1922, a capacitive sensing block 1923, SC/CT functional block 1924, a voltage/current digital-to-analog converter (VIDAC) 1925 and a DSM 1926. Each GPIO 1915 may be coupled to one AG 1905 and one AMUXBUS 1910. Each GPIO 1915 may be coupled to a corresponding AG 1905 through an analog switch 1901. Analog switches 1901 may be large or small. Large analog switches 1901 have lower Z. Small analog switches 1901 have higher Z. The AMUXBUS 1910 may be a shared routing resource connecting every GPIO 1905 through an analog switch 1901. Analog routing 1900 may also include eight analog local buses 1930 to route signals between different analog functional blocks 1921-1926. In one embodiment, there may be eight analog local buses 1930, four on the right side of the device and four on the left side of the device. Analog local buses 1930 from the right and left sides of the device may be coupled together through analog switches 1902. Analog routing 1900 may also include MUXes and switches for IO selection of the analog functional blocks. In one embodiment, analog routing 1900 may provide hierarchical routing to system components. In another embodiment, analog routing 1900 may allow for free, uncontrolled routing to system components.

In a programmable analog device, it is necessary to route signals in a user-configurable manner between arbitrary (or nearly so; some restrictions do exist) sets of terminals. The device must therefore contain a number of wires and switches which can be used to implement the aforementioned routes. This routing structure must be flexible, as it is difficult to predict all situations in which the device will be used. In general, a greater number of switches produces a more flexible routing structure. However, it is also necessary to minimize the number of switches for two reasons. Firstly, a large number of switches will consume an excessive amount of silicon area. Secondly, each switch degrades signal quality by a measurable amount. This includes both "used" switches which are traversed to implement a route, and unused switches "hanging off" of a wire traversed in a route. As described above, the embodiments describe herein involve the strategic placement of a small number of wires switches to achieve a delicate balance between performance, flexibility, and area.

As described in the embodiments below, the programmable analog routing system may include an analog core routing matrix, comprising two sets of wires and programmable connections. These programmable connections may be switches that can be dynamically controlled by a processing core, such as firmware executing on the processing core. In other embodiments, the programmable analog routing system could be implemented in an integrated circuit that is configured one or more times by an external programming device. In this embodiment, the programmable connections are statically programmed by the external programming device. In another embodiment, the external programming device could be coupled to the integrated circuit to configure the programmable connections before or during operation of the integrated circuit. In another embodiment, the programmable analog routing system could be implemented in a circuit in which pin and jumpers could be used to configure the programmable connections (e.g., switches) of the programmable analog routing system. Alternatively, the programmable analog routing system can be implemented in other circuits in other configurations as would be appreciated by one of ordinary skill in the art having the benefit of this disclosure.

Figure 2:
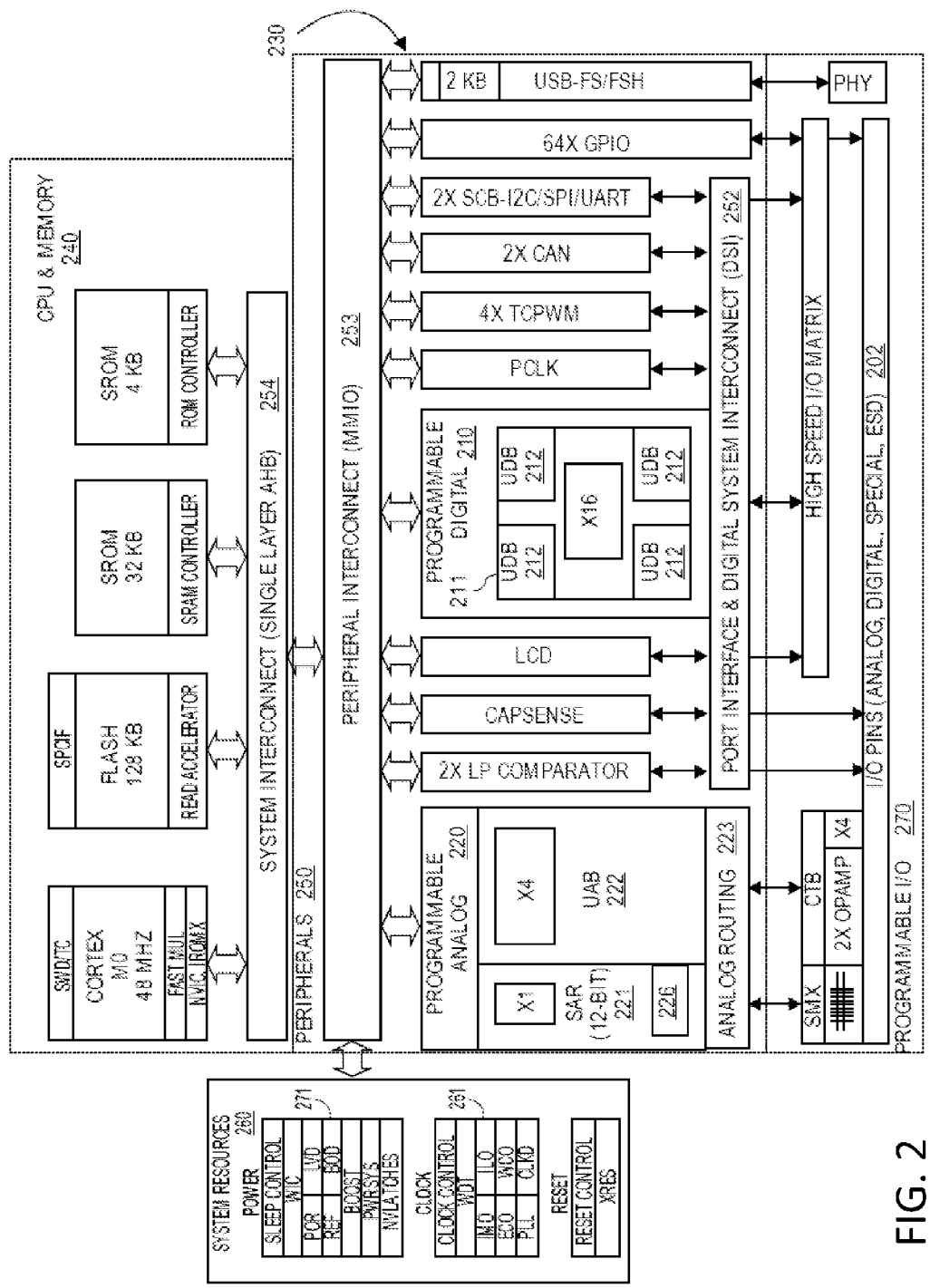
FIG. 2 illustrates another embodiment of a core architecture of a processing device with a programmable routing system.

FIG. 2 illustrates another embodiment of a core architecture of a processing device 200 with a programmable routing system 226. In one embodiment, the processing device 200 has the PSoC®4 core architecture, developed by Cypress Semiconductor Corporation. In the depicted embodiment, the processing device 200 includes a CPU and memory subsystem 240, peripherals 250, system resource 260, and programmable I/O 270. The peripherals 250 include a peripheral interconnect (MMIO) 253), programmable digital subsystem 210, programmable analog subsystem 220, a port interface and digital system interconnect (DSI) 252), and various other components 230, such as comparators, capacitive sensing blocks, LCD direct drive blocks, a CAN interface controller, an I2C M/S, MDBs, and a FSUSB 2.0, as described herein. The MDBs may be configured to perform common digital functions such as timers, counters and pulse-width modulators (PWMs). The various other components may be communication peripherals such as Ethernet, high-speed USB, USB host, PCI Express, IEE1394 serial bus interface, SD card reader and others. The programmable digital subsystem 210 and some of the other components 230 are coupled to the port interface and digital subsystem interconnect (DSI) 252. The programmable digital subsystem 210, the programmable analog subsystem 220 and the other components 230 are coupled to the peripheral interconnect (MMIO) 253. The programmable analog subsystem 220 and some of the other components 230 are coupled to the programmable I/O 270.

The digital subsystem 210 includes a universal digital block array 211, including multiple UDBs 212. The digital subsystem 210 my also include other interface controller, multifunction digital blocks, communication peripherals, or the like. The elements of digital system 210 may be coupled to digital interconnect 252 and/or to a peripheral interconnection (MMIO) 253, which is coupled to the system interconnect 254 of a CPU and memory subsystem 240. The CPU and memory subsystem 240 may include FLASH, SRAM, SROM blocks and a CPU, each coupled to the system interconnect 254. The CPU and memory subsystem 240 may include other components as would be appreciated by one of ordinary skill in the art having the benefit of this disclosure.

The core architecture 200 may also include an analog subsystem 220. The analog subsystem 220 may include successive approximation registers (SARs) ADC block 221, programmable universal analog blocks (UABs) 222, and analog routing 223. In another embodiment, the programmable routing system 226 is implemented in one or more other components of the programmable analog subsystem 220. In another, the programmable routing system 226 can be implemented in other locations as would be appreciated by one of ordinary skill in the art having the benefit of the disclosure. For example, when the programmable routing system is used to route supply signals for digital components, the programmable routing system 226 may be implemented in whole or in part in the digital subsystem 210. Details regarding the programmable routing system 226 are described below with respect to FIG. 3-8.

The core architecture 200 may also include system-wide resources 260. System-wide resources 260 may include a clocking subsystem 261 and power management subsystem 271. Clocking subsystem 261 may include various components as described herein, such as ILO, WDT, clock control, IMO, ECO, PLL, CLKD, WCO, or the like. Power management system 171 may include various components as described herein, such as sleep control, WIC, POR, LVD, REF, BOD, Boost, PWRSYS, NV latches, or the like. In one embodiment, system-wide resources 260 may be coupled to peripheral interconnect 253.

The core architecture 200 may also include multiple pins 202. Pins 202 may be used to connect elements of core architecture 200 to off-chip elements or route signals into, out of on-chip elements or to different pins of the device. Core architecture 200 may also include multiple SIOs and GPIOs. The programmable I/O 270 also may include a high-speed I/O matrix, a physical interface (PHY), Successive Approximation Register multiplexer (SARMUX) (also labeled as SMX), Continuous Time Block (CTB), and the like. For example, a CTB may include two operational amplifiers, a programmable resister string, and part of the analog routing interconnection, including connections to the pins. Core architecture 200 may also include USB input/outputs (USB PHY) 108, which may be coupled to FSUSB 2.0 116.

FIG. 2 illustrates the programmable routing system 226 as being part of the analog subsystem 220 in the context of the entire core architecture of the processing device 200. It should be noted that the embodiments described herein are described in the context of the analog subsystem 220, but may be applied to other parts of the processing device, such as capacitive sensing, touch sensing, LP comparators, or the like.

Within the context of the programmable analog subsystem 220, the programmable routing system 226 can be configured to make connections between various components as described in more detail below.

In the embodiment of FIG. 2, the processing device 200 is described in the context of the PSoC® 4 processing device. In other embodiments, the processing device may be may be one or more other processing devices known by those of ordinary skill in the art, such as a microprocessor or central processing unit, a controller, a special-purpose processor, digital signal processor ("DSP"), an application specific integrated circuit ("ASIC"), a field programmable gate array ("FPGA"), or the like.

Figure 3:
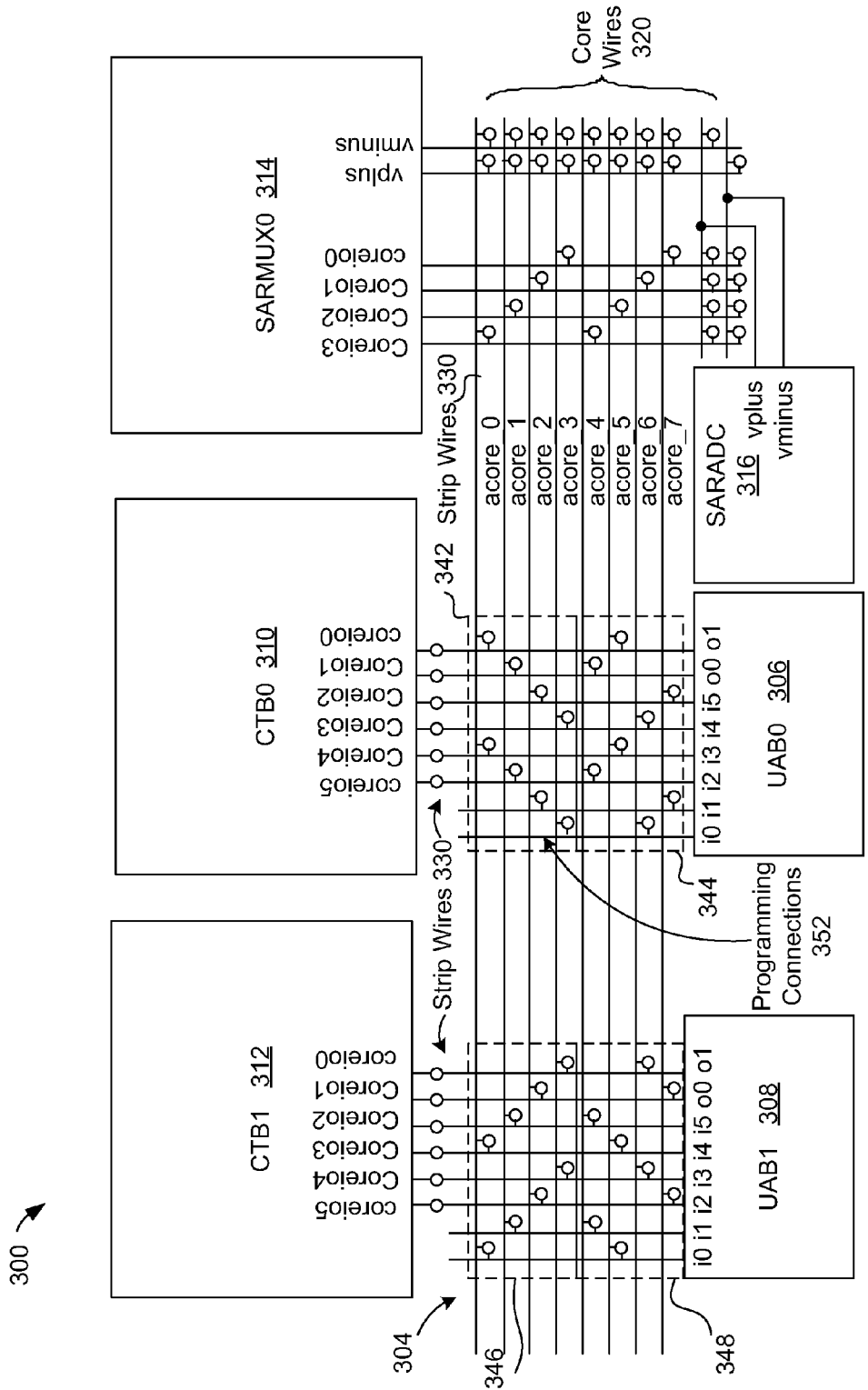
FIG. 3 is a block diagram of one embodiment of a programmable routing system coupled to multiple functional blocks of a processing device.
Figure 4:
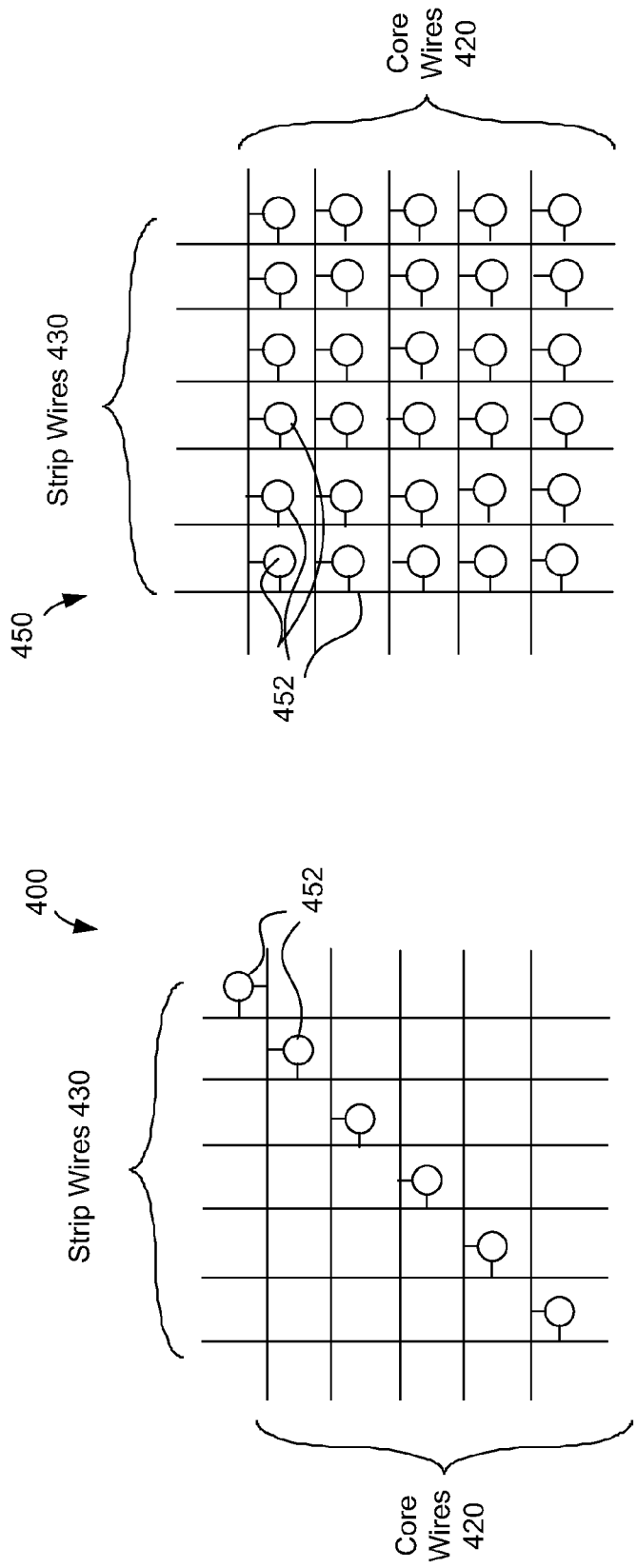
FIG. 4A is a block diagram of one embodiment of a switch pattern of a programmable routing system.
FIG. 4B is a block diagram of another embodiment of a switch pattern of a programmable routing system.

FIG. 3 is a block diagram of one embodiment of a programmable routing system 304 configured to connect multiple functional blocks of a processing device 304. In one embodiment, the processing device 300 corresponds to the processing device 200 of FIG. 2 and the programmable routing system 304 corresponds to the programmable routing system 226. The functional blocks may include UAB0 306, UAB1 308, CTB0 310, CTB1 312, SARMUX0 314, and SARADC 316. In one embodiment, the functional blocks are analog blocks. These functional blocks may be fixed-function blocks or may be programmable blocks. In other contemplated embodiments, the programmable routing system 304 may be used in the digital subsystem, or in both the digital subsystem and the analog subsystem as would be appreciated by one of ordinary skill in the art having the benefit of this disclosure.

In the depicted embodiment, the programmable routing system 304 includes a first set of wires, referred to as core wires 320, and a second set of wires, referred to as strip wires 330. It should be noted that the labels "core wires" and "strip wires" are used for ease of description of the two different purposes of the wires for the two different sets of wires. The programmable routing system 304 also includes multiple programmable connections. The programmable connections are configurable to make either direct connections between two of the functional blocks using the strip wires 330, such as a direct connection between a terminal of UAB1 308 and a terminal of CTB1 312, or a connection between one of the strip wires 330 and one of the core wires 320. For example, the UAB1 308 can be programmed to connect to CTB1 310 by programming one of the programmable connections to couple one of the strip wires 330 to one of the core wires 330, and to couple the one core wire 330 to another one of the strip wires 330 to connect to the CTB1 310.

In one embodiment, the programmable routing system 304 includes multiple switch sets including multiple programmable connections 352 coupled to the strip wires 330. In the depicted embodiment, the programmable routing system 304 includes four switch sets 342-348. In one embodiment, one or more of the switch sets 342-348 include two switches per each of the second set of strip wires 330. In another embodiment, the first switch set 342 includes a four-by-eight (4×8) switch pattern in which four core wires 320 are configurable to connect to two of the eight strip wires 330 coupled between a first programmable block and a second programmable block, such as shown between UAB0 306 and CTB0 310. In another embodiment, the first switch set 342 is a base pattern. In the depicted embodiment, the base pattern is a repeating diagonal pattern. Of course, other patterns may be used as described herein. A second switch set 354 includes another 4×8 switch pattern in which four more core wires 320 are configurable to connect to two of the same eight strip wires 330 as the first switch set 342. A third switch set 346 includes another 4×8 switch pattern in which the same four core wires 320 as the first switch set 342 are configurable to connect to two of another eight strip wires 330 coupled between a third programmable block and a fourth functional blocks, such as shown between UAB1 308 and CTB1 312. A fourth switch set 348 includes another 4×8 switch pattern in which the same four core wires 320 as the second switch set 344 are configurable to connect to two of the eight strip wires 330 as the third switch set 346.

In one embodiment, the switch pattern of the third switch set 346 is a flipped pattern of the base pattern, the fourth switch set 348 is a rotated pattern of the base pattern, and the second switch set 344 is a rotated pattern of the third switch set 346 (or a flipped pattern of the fourth switch set 348. As described herein, other base patterns, flipped, and rotated patterns may be used as would be appreciated by one of ordinary skill in the art having the benefit of this disclosure.

It should be noted that the routing interconnect can be sparse in some locations because of the permutability within the CTBs and UABs. In particular, the permutability of connections within one block makes it so it does not matter whether, for example, a connection is made to input i0 or input i1 when trying to reach UAB0. It could also be said that the routing interconnection provides permutability among inputs to a given CTB or UAB. As described in more detail below, the embodiments described herein provide a balance between flexibility of the programmable connections and reducing the number of programmable connections overall. The locations of the permutable connections are near resources and IOs and the non-permutable connections are between the strip and core wires. In essence, the programmable routing system provides a balance between permutable connections and non-permutable connections where it makes most sense for typical circuit designs. For example, in one embodiment, the switch pattern connects each of the second set of wires (strip wires) to two of the first set of wires (core wires). These switch patterns, and other variations contemplated herein, provide more flexibility than a single switch per wire (illustrated in FIG. 4A), while using less silicon and providing better performance than a switch at each intersection of the strip and core wires (illustrated in FIG. 4B).

In one embodiment, the processing device 200 includes multiple I/O pins and the core wires 330 are not coupled directly to the I/O pins. The programmable routing system 304 permits the presence of undedicated wires used for arbitrary signals, and the direct connections that optimize common connections between functional blocks.

Routes between a CTB (310) and a UAB (306), designated as strip wires 330, are expected to be frequently used, so they are given direct connections which are optimized for, but not dedicated to, this purpose. However, while it is ideal to restrict connections to terminals within the same strip, it is not always practical to do so. For example, a user may wish to connect a signal to more destinations than are possible given the limited number of resources that a strip contains. Therefore, the core wires 320 allow flexibility when routing between strips (e.g. routing from CTB3 to UAB1).

Transitions between core wires 320 and strip wires 330 may be facilitated by a matrix of switches. The patterns are designed so as use a minimal number of switches while still allowing most combinations of inputs to be routed. This is best facilitated by a randomized layout of switches. However, a truly random arrangement would complicate chip design. Therefore, a more systematic approach was used for switch pattern selection. As illustrated, a 4×8 "base pattern" may be used such that each strip wire 330 is configurable to connect to two core wires 320. This base pattern can be used to cover a common usage scenario in which a signal originates on one strip wire 330 from a first programmable block (e.g., UAB1 308), and the programmable routing system 304 uses a core wire 320 to travel across the device (e.g., integrated circuit), and then transfers back to another strip wire 330 to reach its destination at another programmable block that is not coupled to the same strip wires (e.g., CTB0 310). The second switch on each core wire 320 may provide greater flexibility for this second transition. In further embodiments, three additional "switch sets" are generated by flipping and rotating a "base" switch pattern. More importantly, the switch pattern for each strip contains a different combination of these four switch sets. The result is a switch arrangement which appears and behaves as though it were randomly selected, but which is much more straightforward to implement on silicon.

While the total number of switches used for this architecture is comparable to that used for processing device 100 (e.g., the PSoC®3/5 device), the programmable routing system 304 provides significantly improved flexibility. This may be due to two characteristics. Firstly, the direct routing between strips increases the number of signals which can be routed without consuming "global" routing resources. Secondly, there is an increased number of truly undedicated routing resources which provide flexibility for the implementation of less common routes.

The switch patterns may vary from those depicted in FIG. 3. For example, the switch density could be reduced at the expense of flexibility while maintaining the same overall routing structure. For example, the pseudo-random switch patterns may be replaced with a regular diagonal pattern 400, as shown in the depicted embodiment of FIG. 4A. The switch pattern 400 includes a programmable connection 452 (e.g., switch) to make a connection between one of the core wires 420 and the strip wires 430. It should be the switch pattern 400, as compared to those illustrated in FIG. 3, may reduce the flexibility of the architecture. It should also be noted that FIG. 3 illustrates only a few functional blocks, but the programmable routing system can be used in circuits using more or less functional blocks as would be appreciated by one of ordinary skill in the art having the benefit of this disclosure.

FIG. 4B is a block diagram of another embodiment of a switch pattern 450 of a programmable routing system. The switch pattern 450 includes programmable connections 452 at each intersection between the core wires 420 and the strip wires 430. It should be noted that the switch pattern 450 may provide additional flexibility, but may result in a larger amount of silicon area to implement. Furthermore, the programmable connections 452 at each of the intersection between the core wires 420 and the strip wires 430 may introduce additional parasitic capacitance, which may degrade signal quality.

Figure 5:
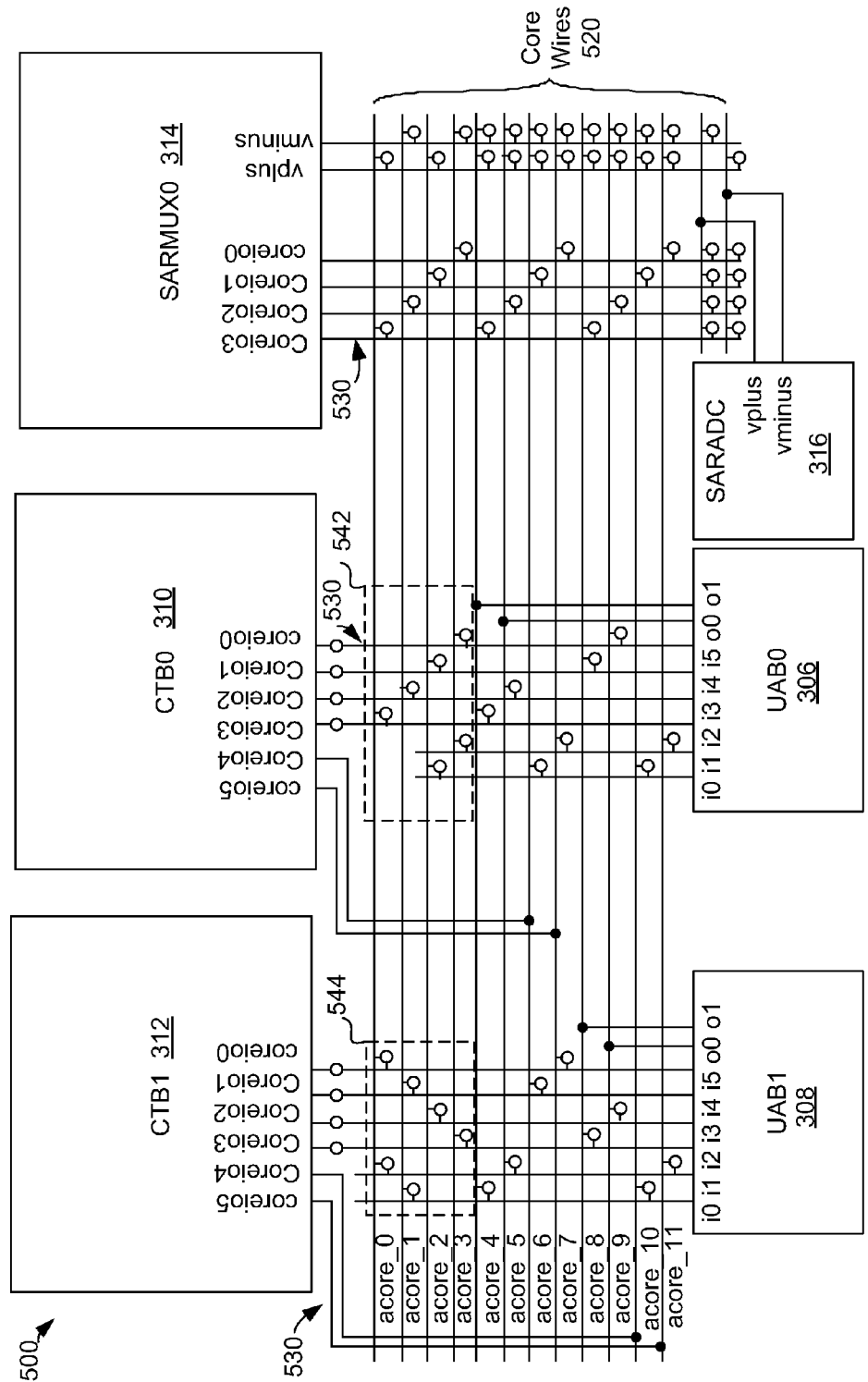
FIG. 5 is a block diagram of another embodiment of a programmable routing system coupled to multiple functional blocks of a processing device.

FIG. 5 is a block diagram of another embodiment of a programmable routing system 500 coupled to multiple functional blocks of a processing device. The programmable routing system 500 is similar to the programmable routing system 300 except that it includes a variant in which each horizontal wire is directly connected to an output of one of the functional blocks. More specifically, two of the terminals of the CTB0 310 (e.g., coreio5 and coreio4) are directly connected to two of the core wires 520. Similarly, the CTB1 312 (e.g. coreio5 and coreio4) are directly connected to two other core wires 520. These strip wires 530 are considered dedicated wires. The remaining terminals of the CTB0 310 and CTB1 312 are coupled to programmable connections that can make a connection between corresponding core wires 520 and strip wires 530. These strip wires 530 are considered undedicated wires. The undedicated wires are connected to the core wires 520 via the different switch patterns 542 and 544 similar to those described above. Two output terminals of the UAB0 306 and UAB1 308 are directed coupled to two core wires 520, respectively. The undedicated wires can be used to provide flexibility of the programmable routing system. For example, the programmable routing system may provide the advantage that there is one less switch in most paths. Particularly those that cross between strip wires include one less switch in the path because an output may not need to traverse a switch to reach a core wire 520. It should be noted that although it reduces the number of switches, the programmable routing system 500 may not be as flexible for programming routes as described above due to the reduced number of undedicated core wire routes.

Figure 6:
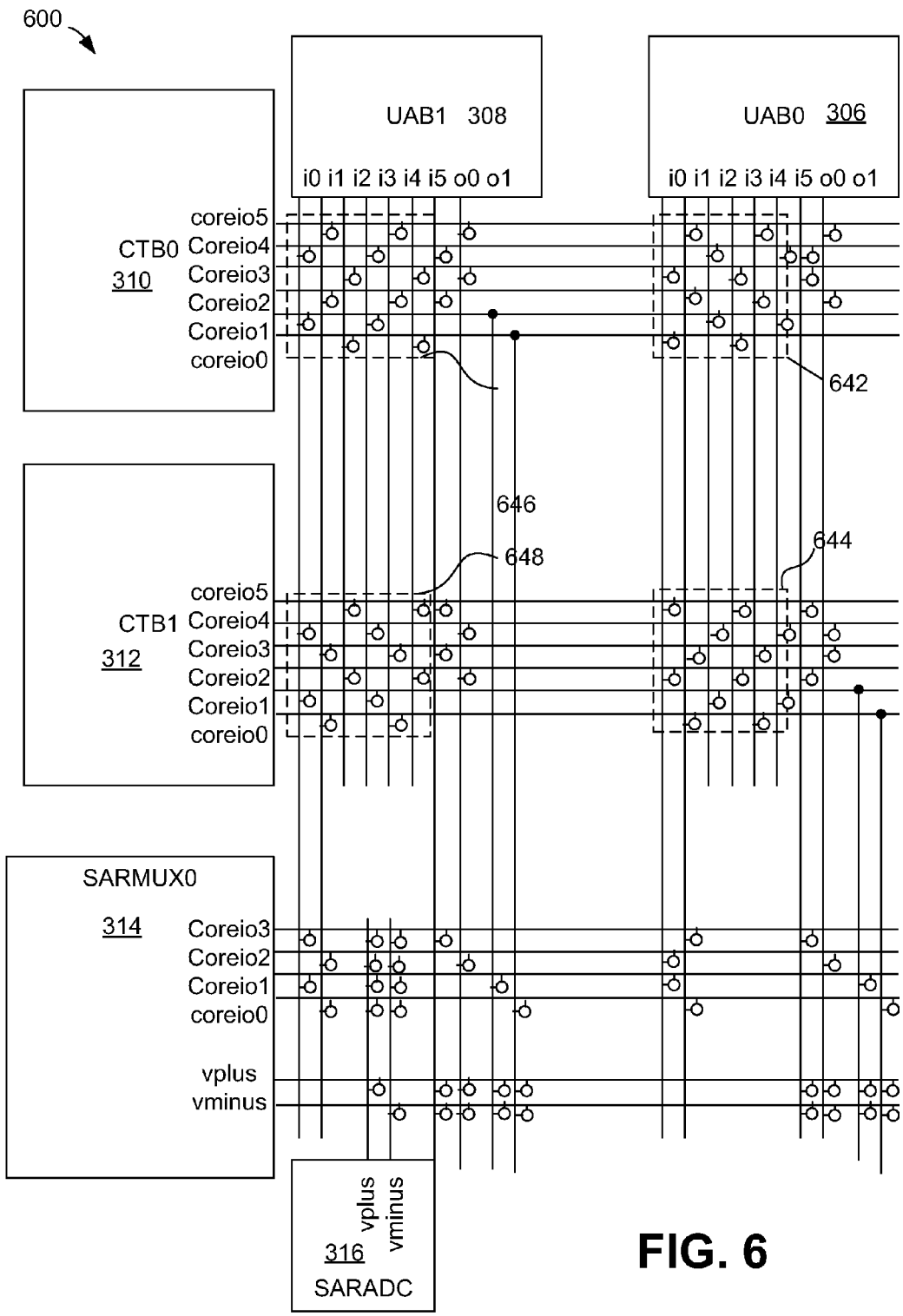
FIG. 6 is a block diagram of another embodiment of a programmable routing system coupled to multiple functional blocks of a processing device.

FIG. 6 is a block diagram of another embodiment of a programmable routing system 600 coupled to multiple functional blocks of a processing device. The programmable routing 600 is a grid-like approach. To facilitate CTB-UAB connections, the CTBs 310, 312, and SARMUX0 314 are arranged on one side of a grid while the UABs 306 and 308 are arranged on another side of the grid. The switch patterns 642-648 are used are intersections between a first set of wires disposed in a first direction of the grid and a second set of wires disposed in a second direction of the grid. The switch patterns 642-648 include programmable connections to make connections between the two sets of wires to connect a CTB to a UAB, for example. In theory, this arrangement could provide the greatest flexibility. However, this configuration may need an increased number of wires and switches to achieve the flexibility. For example, in a sufficiently populated grid, any functional block can connect to any other functional block with at most two switches, and any CTB-UAB connection, which may be the most common usage, can be implemented in exactly one switch. In effect, there is no penalty for going outside of a CTB-UAB strip. One challenge that the grid architecture poses for layout may be that the CTB and UAB are on the same order of magnitude with regard to size and the switches are significantly smaller than that. Therefore, it may be more efficient to layout the CTBs and UABs in two adjacent rows, as is done in the non-grid architecture variants, since a grid layout may waste a large amount of space in the center. One way to avoid this would be to translate the grid architecture during layout into another layout that retained the same connectivity as the grid architecture but was laid out in a manner more similar to the other embodiments. Also, as noted herein, the grid architecture may not scale as well as the non-grid architectures for larger integrated circuits.

In another embodiment, the programmable routing system includes a clustered grid in which, to reduce the area requirements, a switch pattern in an upper-right quadrant and another switch pattern in a lower-left quadrant are much more sparsely populated than the upper-left quadrant and the lower-right quadrant.

It should be noted that the architectures depicted in the various embodiments can be scaled up to include wires and programmable connections to accommodate more connections between functional blocks. For the non-grid architectures, this may be accomplished by adding additional strip wires and increasing the number of core wires. For a single source variant, additional number of undedicated cores wires may be added. For the grid architectures, the size of the architecture may be scaled up in a natural manner by adding more wires to the first set of wires and adding more second set of wires for each newly added CTB and UAB, then rotate through the switch patterns to populate the junctions. However, the additional switch patterns increase the number of switches exponentially. One approach to reducing the number of switches may include sparsely populating some of the quadrants of the grids as described herein.

In another embodiment, segmentation switches can be introduced on the core wires in a base architecture to increase the number of core wires available for routes which are restricted to one half of the architecture (which may often occur), while still providing the ability to traverse across the entire architecture when necessary.

Figure 7:
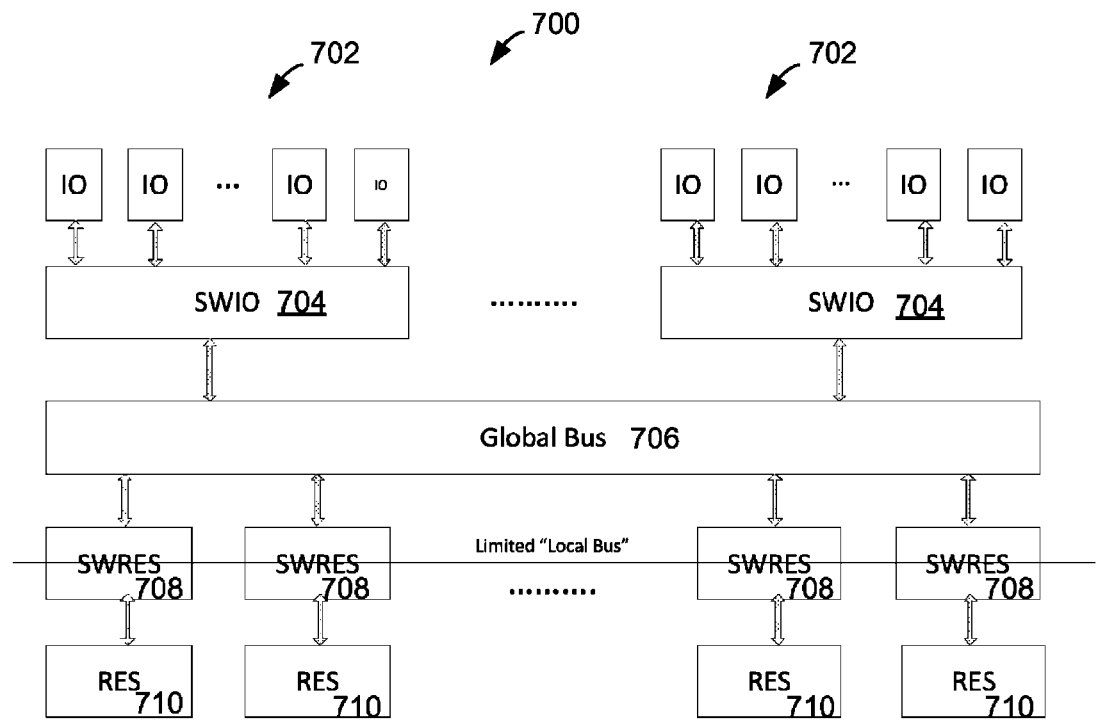
FIG. 7 is a block diagram illustrating a conceptual architecture of the processing device 100 of FIG. 1 according to one embodiment.

FIG. 7 is a block diagram illustrating a conceptual architecture 700 of the processing device 100 of FIG. 1 according to one embodiment. The architecture 700 includes multiple I/O pins 702 coupled to switchable I/Os (SWIOs) 704. The switchable ports 704 are coupled to a global bus 706. Multiple switchable resources 708 are coupled to the global bus 706 and multiple non-switchable resources 710 are coupled to the switchable resources 708. The switchable resources 708 are used to implement a limited local bus. The architecture 700 is a coarse-grained architecture and flat. The global bus figuratively represents a single highway through town. The SWIOs 704 are sparsely connected to a small set of wires. The wires span many ports (e.g., set of 8 I/O pins 702), and the wire lengths contribute to parasitic capacitance. The SWRES 708 are sparsely connected to a small set of wires. In general, each wire has many connections and is therefore very expensive, such as in terms of silicon area. This leads to processing devices that have very few wires in the routing architecture, which may lead to limited routing.

Figure 8:
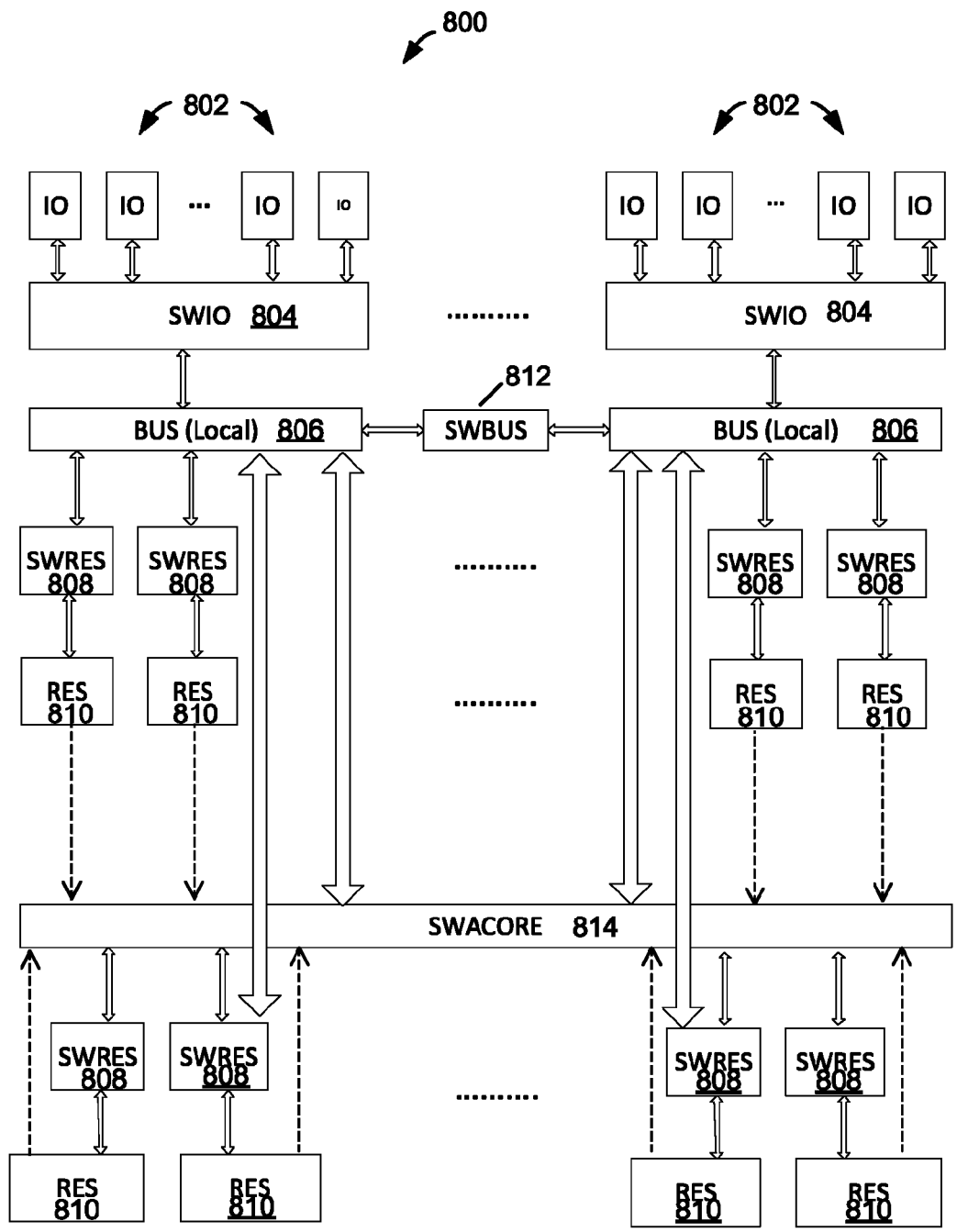
FIG. 8 is a block diagram illustrating a conceptual architecture of the processing device 200 of FIG. 2 according to another embodiment.

FIG. 8 is a block diagram illustrating a conceptual architecture 800 of the processing device 200 of FIG. 2 according to another embodiment. The architecture 800 includes multiple I/O pins 802 coupled to switchable I/O (SWIOs) 804. The switchable ports 804 are coupled to multiple local buses 806, which may be coupled using a switchable bus 812. Multiple switchable resources 808 are coupled to the local buses 806 and resources 810. The local buses 806 are also coupled to switchable analog core wires 814. The non-switchable resources 810 may also be directly coupled to the switchable analog core wires 814. This architecture can also be scaled to include additional switchable resources 808, non-switchable resources 810.

In one embodiment, the architecture 800 is medium-fine grained as compared to the architecture 700. The architecture 800 is multilevel and has figurative highways with the SWACORE 814, figurative surface streets with the I/O 802 and SWIO 804, and shortcuts with the local buses 806. In one embodiment, the switch patterns have different characteristics. SWIO 804 connects an I/O 802 to a bus 806 and is densely or fully populated. The SWRES 808 provides a connection from a resource 810 to a bus 806 and is densely populated. The SWBUS 812 provides a connection between the buses 806. This may be used for situations where there is a shortcut between two buses. For example, the routing between adjacent CTS. The SWACORE 814 provides a general-purpose switching matrix that can be less densely populated than the buses 806 because the permutability is handled near the resources 810. The SWACORE 814 may provide a significant difference between the various architecture variations in multiple ways. For example, the layout of the wires and switches in the switch boxes may vary. This may be the case between the grid and multi-source as presented in the architecture depicted in FIG. 3 for example, or between single sources and single source extended in other embodiments. It should be noted that "single source" means that each of the "core wires" is hardwired to one output. Single-source results in one fewer series switch for any connection (since there is no need to pass through a switch before connecting to a core wire), in exchange for an increased number of core wires (because there must exist as many core wires as there are outputs). "Single source extended" means that the output of each UAB extends all the way into the paired CTB. In terms of FIG. 10, "extended" would be an arrow from each of the bottom RES blocks to the SWRES for the resource directly above it. It should be noted that single source versus single source extended is a minor variation, whereas the difference between single source and multi-sources, in which multiple outputs are switched onto each core wires, is a fundamentally different way of implementing the embodiments described herein as would be appreciated by one of ordinary skill in the art having the benefit of this disclosure. In another way, the connections into and out of SWACORE 814 can vary. For example, the single source variants have dedicated connections from resource output terminals into SWACORE 814. In another embodiment, the SWACORE 814 may be subdivided into multiple segments and could be joined by a SWBUS (like SWBUS 812). The SWIOs 804, as compared to the SWIO 704, are densely connected to a small set of wires, and the SWBUS 812 is densely connected to a small set of wires. It should also be noted that the dashed arrows represent single-source variants.

In general, most wires are comparatively short as compared to the wires of architecture 700. In addition, because most permutability is located near the pins or the resources, this allows the longer wires to have many fewer connections because they do not need to account for all possible connections. This makes each wire much less expensive, allowing many more wires to be included in the architecture 800 as compared to the architecture 700.

For comparison, the architecture 700 has sparely populated to connect to a small set of wires (e.g., 4), and the architecture 800 has densely populated to connect to a small set of wires (e.g., 4). The SWIO 704 connects to a set of very long set of wires across many ports (multiple set of I/O pins) and the SWIO 804 connects to a set of very short wires that only span a port (a set of I/O pins). The global bus 706 has very few wires with very high capacitance. The local buses 806 may be confined to a SWIO for better performance. The local buses 806 can be segmented and can be used as bridges.

The embodiments described herein may be used to provide connectivity between the various analog peripherals present in processing devices, such as the PSoC®4 family processing devices. In one embodiment, firmware can be used to turn switches on and off to achieve the desired connectivity between functional blocks of the processing device. In one embodiment, a user does not directly create the firmware, but could use a software tool to automatically generate a routing configuration, such as the PSoC® creator. For example, a representation of an architecture may be used an input to an analog routing tool included in the software tool. In addition to the representation of the architecture, the software tool receives a representation of the circuit the user wishes to implement using the architecture.

Figure 9:
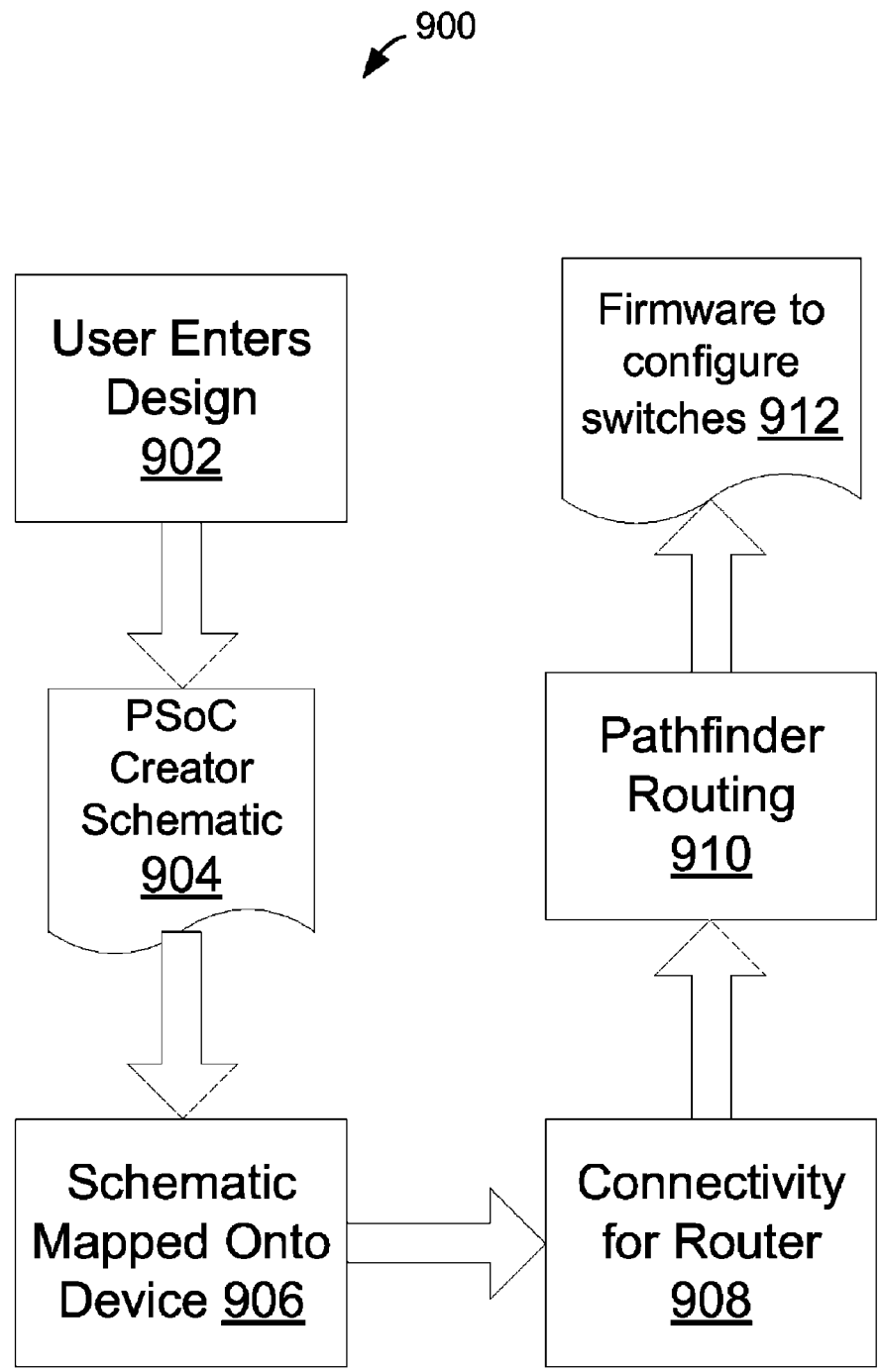
FIG. 9 is a flow diagram of a method of programming a routing configuration of a programmable routing system according to one embodiment.

FIG. 9 is a flow diagram of a method 900 of programming a routing configuration of a programmable routing system according to one embodiment. In the method 900, a user uses a schematic capture feature of a software tool to draw a schematic of a design to be implemented in the processing device (block 902). The software tool receives the input (block 904), and the software tool maps the resources in the user design onto the resources available on the processing device (block 906). One result of this process is a description of the connectivity which must be achieved using the routing resources on the device (block 908). The method 900 then uses the software tool to perform path routing (block 910). For example, the path routing can execute a pathfinder negotiated congestion routing algorithm that is used to find a set of routes, if one exists, to implement the user's requested functionality. The switches used to implement these routes are used to configure the processing device. The software tool generates firmware code to apply these switch settings at device startup (block 912), and the method 900 ends.

In another embodiment, the programmable routing system is programmed by an external programming device. In this embodiment, the integrated circuit comprising the programmable routing system receives instructions or signals from the external programming device to configure the programmable connections to connect the functional blocks of the integrated circuit. In one embodiment, processing logic receives these instructions or signals and configures the programmable routing system accordingly. In another embodiment, processing logic can sets bits in a register to configure the programmable connections. Alternatively, other techniques may be used to configure the programmable connections, such as manually programming the programmable connections.

Figure 10:
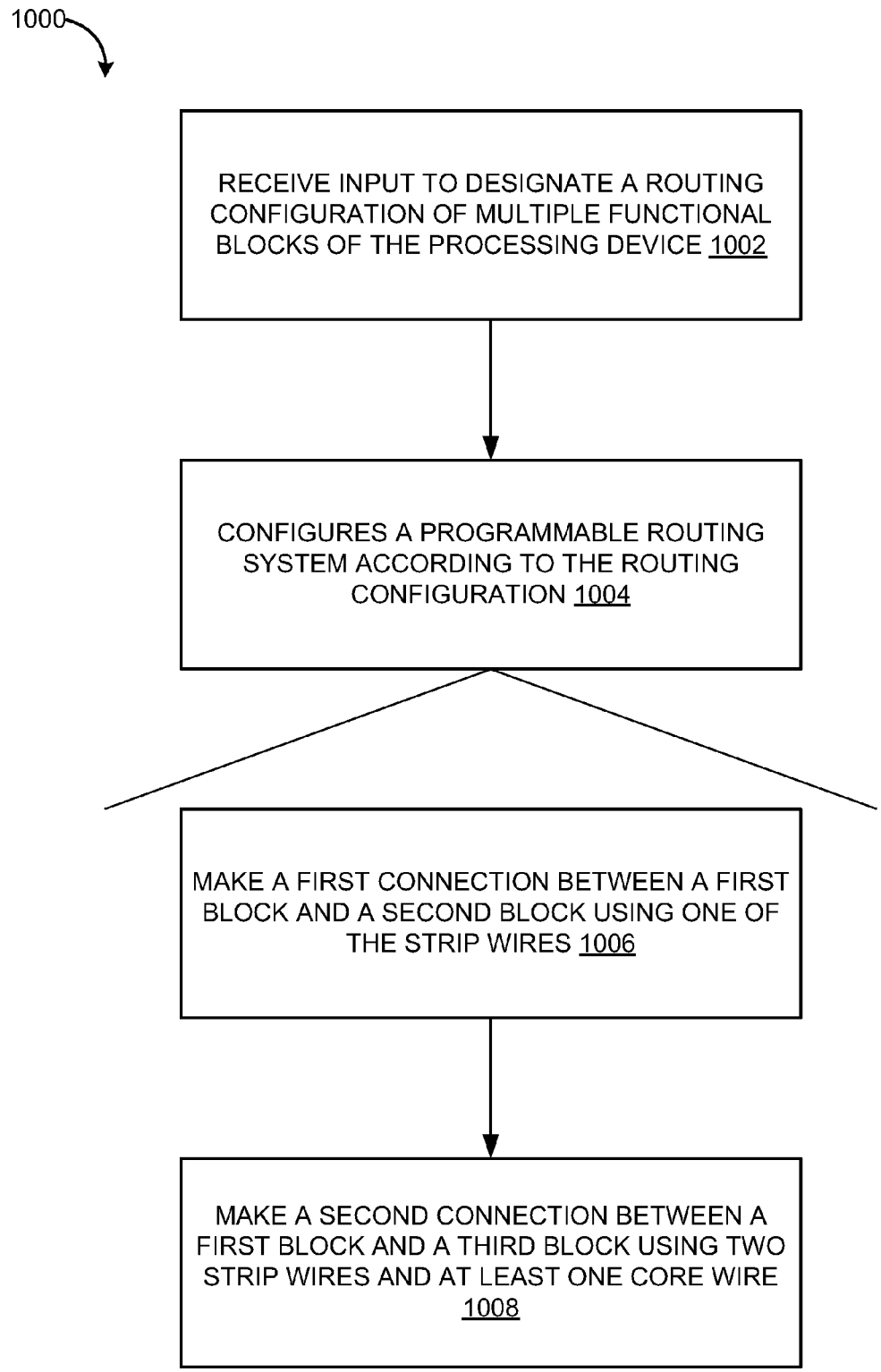
FIG. 10 is a flow diagram of a method of configuring a programmable routing system according to one embodiment.

FIG. 10 is a flow diagram of a method 1000 of configuring a programmable routing system according to one embodiment. The method 1000 may be performed by processing logic that may include hardware (circuitry, dedicated logic, etc.), software (such as is run on a general purpose computing system or a dedicated machine), firmware (embedded software), or any combination thereof. In one embodiment, the processing device 200 performs the method 1000. In another embodiment, the programmable routing system 226 performs the method 1000.

Referring to FIG. 10, the method 1000 begins with receiving input at a processing device to designate a routing configuration of multiple functional blocks of the processing device (block 1002). The processing logic generates configuration information for a programmable routing system according to the routing configuration (block 1004). The programmable routing system comprises a first set of core wires and multiple switch sets comprising multiple programmable connections coupled to a second set of strip wires. In one embodiment, the programmable routing system comprises making a first connection between a first programmable block and a second programmable block using at least one of the second set of strip wires (block 1106) and making a second connection between the first programmable block and a third programmable block using at least two of the second set of strip wires and at least one of the first set of core wires (block 1008). In a further embodiment, the first programmable block is an analog CTB and the second programmable block is an analog UAB. In another embodiment, the routing configuration is automatically created by a software tool. In another embodiment, the processing logic configures the programmable routing system using firmware executing on the processing device.

The embodiments described herein may be used to improve the flexibility of the analog subsystem, providing a higher amount of potential functionality within the same silicon area. To be meaningful, the processing device uses a set of analog peripherals between which it can route signals. The programmable connections, which may each include a programmable switch, can be set using various techniques, such as firmware executing on a microcontroller unit. Due to the complexity of routing multiple routes between multiple functional blocks, a software tool may be used to determine the switch settings. The embodiments described herein may be applied to any architecture in which it is necessary to flexibly connect multiple points, and in which each switch (or equivalent) has a non-trivial monetary or performance cost. This results in increased flexibly without increased cost. This flexibility may be used to allow the processing device to implement functions that were not considered during the design of the architecture. These embodiments may also reduce the time to market for a particular processing device.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The computer-readable transmission medium includes, but is not limited to, electrical, optical, acoustical, or other form of propagated signal (e.g., carrier waves, infrared signals, digital signals, or the like), or another type of medium suitable for transmitting electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An integrated circuit comprising:
a plurality of analog functional blocks; and
a programmable analog routing system coupled to the plurality of analog functional blocks, wherein the programmable analog routing system comprises:
a first set of wires; and
a plurality of switch sets comprising a plurality of programmable connections coupled to a second set of wires, wherein the programmable connections are configurable to make at least one of a direct connection between two of the plurality of analog functional blocks using the second set of wires or a connection between one of the second set of wires and one of the first set of wires,
wherein a first switch set of the plurality of switch sets comprises a four-by-eight switch pattern in which four wires of the first set are configurable to connect to two of eight wires of the second set coupled between a first programmable block and a second programmable block of the plurality of analog functional blocks.

2. The integrated circuit of claim 1, wherein at least one of the plurality of switch sets comprises two switches per each of the second set of wires.

3. The integrated circuit of claim 1, wherein the plurality of analog functional blocks comprises at least one programmable block.

4. The integrated circuit of claim 1, wherein the plurality of analog functional blocks comprises at least one fixed-function block.

5. The integrated circuit of claim 1, wherein the first switch set is a base pattern, and wherein a second switch set of the plurality of switch sets comprises a four-by-eight switch pattern that is a rotated pattern of the base pattern.

6. The integrated circuit of claim 1, wherein the first switch set is a base pattern, and wherein a second switch set of the plurality of switch sets comprises a four-by-eight switch pattern that is a flipped pattern of the base pattern.

7. The integrated circuit of claim 1, wherein a second switch set of the plurality of switch sets comprises a four-by-eight switch pattern in which another four wires of the first set are configurable to connect to two of the eight wires of the second set coupled between the first programmable block and the second programmable block.

8. The integrated circuit of claim 7, wherein a third switch set of the plurality of switch sets comprises a four-by-eight switch pattern in which the other four wires of the first set are configurable to connect to two of another eight wires of the second set coupled between a third programmable block and a fourth programmable block of the plurality of analog functional blocks, and wherein a fourth switch set of the plurality of switch sets comprises a four-by-eight switch pattern in which the four wires of the first set are configurable to connect to two of the other eight wires of the second set coupled between the third programmable block and the fourth programmable block.

9. The integrated circuit of claim 8, wherein the first switch set is a base pattern, wherein the third switch set is a flipped pattern of the base pattern, the second switch set is a first rotated pattern of the base pattern, and the fourth switch set is a second rotated pattern of the third switch set.

10. The integrated circuit of claim 7, wherein the first programmable block is an analog continuous time block (CTB) and the second programmable block is an analog universal analog block (UAB).

11. The integrated circuit of claim 1, wherein the programmable analog routing system is configured by an external programming device coupled to the integrated circuit.

12. A method comprising:
receiving input at a processing device to designate a routing configuration of a plurality of analog functional blocks of the processing device; and
generating configuration information, by the processing device, for a programmable analog routing system according to the routing configuration, wherein the programmable analog routing system comprises a first set of wires and a plurality of switch sets comprising a plurality of programmable connections coupled to a second set of wires, wherein configuring the programmable analog routing system comprises:
making a first connection between a first programmable block and a second programmable block of the plurality of analog functional blocks using at least one of the second set of wires; and
making a second connection between the first programmable block and a third programmable block of the plurality of analog functional blocks using a first switch set of the plurality of switch sets comprising a four-by-eight switch pattern in which four wires of the first set are configurable to connect to two of eight wires of the second set.

13. The method of claim 12, wherein the first programmable block is an analog continuous time block (CTB) and the second programmable block is an analog universal analog block (UAB).

14. The method of claim 12, wherein the routing configuration is automatically created by a software tool.

15. The method of claim 12, wherein the configuring comprises configuring the programmable analog routing system using firmware executing on the processing device.

16. An apparatus comprising:
a plurality of analog blocks; and
a programmable analog routing system comprising a plurality of programmable connections coupled to a first set of wires and a second set of wires, wherein the plurality of programmable connections are configured to couple a first analog block and a second analog block of the plurality of analog blocks using at least one of the second set of wires and to couple the first analog block and a third analog block of the plurality of analog blocks using a first switch set comprising a four-by-eight switch pattern in which four wires of the first set are configurable to connect to two of eight wires of the second set.

17. The apparatus of claim 16, wherein the first analog block is a continuous time block (CTB) and the second analog block is a universal analog block (UAB).

18. The apparatus of claim 17, wherein the third analog block is a second UAB.

19. The apparatus of claim 16, further comprising a processing core configured to execute firmware to configure the plurality of programmable connections of the programmable analog routing system using a routing configuration.

20. The apparatus of claim 19, wherein the plurality of programmable connections are configured in a switch pattern in which there are two programmable switches per each of the second set of wires.

\* \* \* \* \*